United States Patent
Tanaka et al.

(10) Patent No.: US 6,793,902 B2
(45) Date of Patent: Sep. 21, 2004

(54) SEED CRYSTAL FOR PRODUCTION OF SILICON SINGLE CRYSTAL AND METHOD FOR PRODUCTION OF SILICON SINGLE CRYSTAL

(75) Inventors: Masahiro Tanaka, Yamaguchi (JP); Yutaka Kishida, Yamaguchi (JP); Teruyuki Tamaki, Yamaguchi (JP); Hideo Kato, Yamaguchi (JP); Seiki Takebayashi, Yamaguchi (JP)

(73) Assignee: Siltronic AG, Munich (DE)

( * ) Notice: Subject to any disclaimer, the term of this patent is extended or adjusted under 35 U.S.C. 154(b) by 131 days.

(21) Appl. No.: 10/316,402

(22) Filed: Dec. 11, 2002

(65) Prior Publication Data
US 2003/0172864 A1 Sep. 18, 2003

(30) Foreign Application Priority Data
Dec. 20, 2001 (JP) ........................ 2001-388268

(51) Int. Cl.$^7$ ................ C01B 33/26; C30B 15/20
(52) U.S. Cl. .................. 423/328.2; 117/13; 117/19
(58) Field of Search ............... 117/13, 19; 423/328.2

(56) References Cited

U.S. PATENT DOCUMENTS

| | | | |
|---|---|---|---|
| 3,271,118 A | | 9/1966 | Bhola |
| 5,714,267 A | | 2/1998 | Machida et al. |
| 6,080,237 A | * | 6/2000 | Iwasaki et al. ............. 117/13 |
| 6,506,251 B1 | | 1/2003 | Kitigawa et al. |
| 6,670,036 B2 | * | 12/2003 | Iino et al. ................. 428/402 |

| 2001/0020438 A1 | 9/2001 | Hoshikawa et al. |

FOREIGN PATENT DOCUMENTS

WO            01/63026           8/2001

OTHER PUBLICATIONS

Huang, X. et al., Japanese Journal of Applied Physics, vol. 39, No. 11B, Nov. 15, 2000.
Patent Abstract of Japan Corresponding to JP 09–249492.
Patent Abstract of Japan Corresponding to JP 04–139092.
Patent Abstract of Japan Corresponding to JP 08–104595.
Patent Abstract of Japan Corresponding to JP 09–249492.

* cited by examiner

*Primary Examiner*—Felisa Hiteshew
(74) *Attorney, Agent, or Firm*—Collard & Roe, P.C.

(57) ABSTRACT

In the manufacture of a silicon single crystal by the Czochralski method, there is provided a seed crystal for use in the production of the silicon single crystal. This seed crystal is capable of preventing creation of a dislocation occurring during the immersion of the seed crystal in the molten silicon and withstanding the load of a silicon single crystal of great weight as well. There is also a method for the production of the seed crystal and a method for the production of a silicon single crystal which enables the ratio of elimination of dislocation to be increased. A seed crystal for the production of a silicon single crystal for use in the manufacture of a silicon single crystal by the Czochralski method, has the boron concentration in the silicon single crystal as the matrix from which the silicon seed crystal is excised is not less than $4 \times 10^{18}$ atoms/cm$^3$ and not more than $4 \times 10^{19}$ atoms/cm$^3$ and the silicon seed crystal is excised from the silicon single crystal as the matrix, ground, and lapped, and subsequently subjected to surface etching.

4 Claims, 1 Drawing Sheet

Dependency of thickness of processing strain layer on granularity of grindstone $Y = \exp(-4.96 \times \log A + 18.7)$

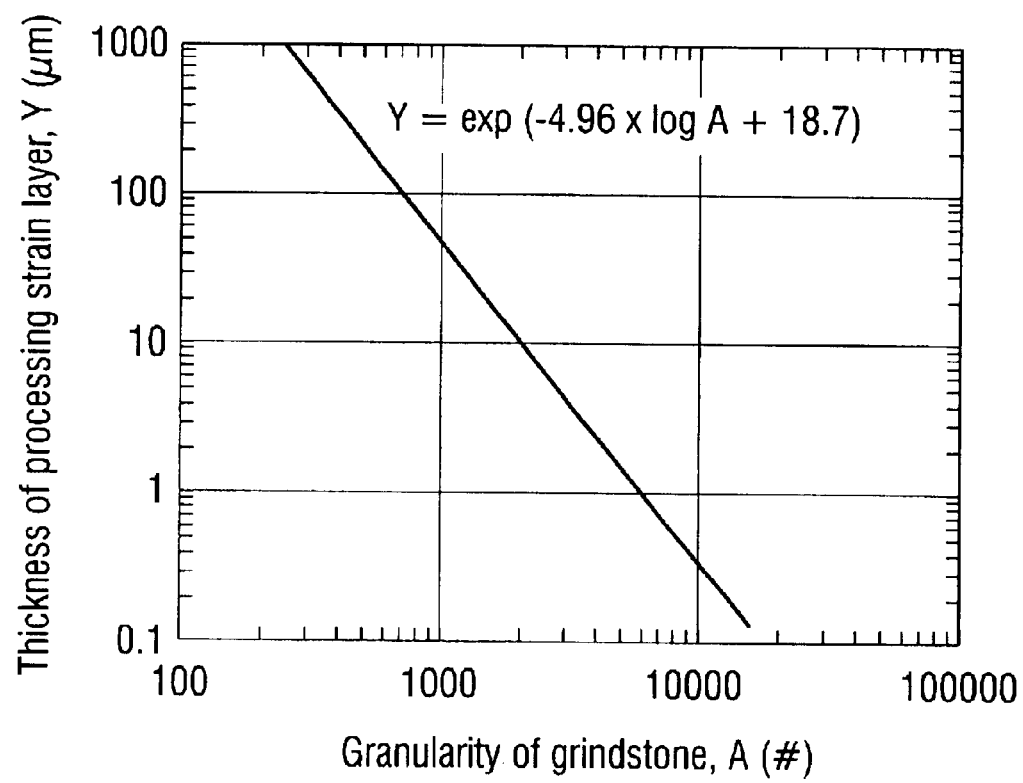
Fig. 1 Dependency of thickness of processing strain layer on granularity of grindstone though the prior art indeed has succeeded
SEED CRYSTAL FOR PRODUCTION OF SILICON SINGLE CRYSTAL AND METHOD FOR PRODUCTION OF SILICON SINGLE CRYSTAL

BACKGROUND OF THE INVENTION

1. Field of the Invention

The present invention relates to a silicon seed crystal for use in the manufacture of a silicon single crystal by the Czochralski method and to a method for the production of a silicon single crystal by the use of the seed crystal.

2. Prior Art

In the production of a silicon single crystal by the Czochralski method, a silicon seed crystal is immersed in molten silicon and then grown until a desired diameter is attained. When the silicon seed crystal is immersed in the molten silicon, it generally generates a dislocation, or a crystal defect, with the immersed portion thereof as the center. The main reason for the generation of this dislocation is thought to be the thermal stress which is induced by a temperature difference occurring in the seed crystal before and after the immersion thereof into the melt. In the production of a silicon single crystal, it is indispensable to prevent the generation of dislocation or to remove the site of the generated dislocation. As a means to remove the dislocation which has occurred during the immersion, the dash necking process which provisionally decreases the diameter of the seed crystal after the immersion has previously been utilized. The largest decreased diameter that allows perfect elimination of the dislocation by the dash necking is about 4 mm. The dislocation cannot be perfectly eliminated when this diameter increases from this size.

Regarding the strength of the silicon for supporting the silicon single crystals which have acquired increased weights as a consequence of the trend in recent years toward silicon single crystals having increased diameters, the decreased diameter of 4 mm has the possibility of permitting the silicon to sustain a fracture. Thus, a method of producing the single crystal without requiring formation of a decreased diameter which poses a problem as to the strength of the silicon has been disclosed in the official gazette of JP-A-09-249,492. This prior art thus pertains to a technique which purports to increase the strength of a seed crystal by increasing the boron concentration in the seed crystal. It also inhibits the generation of a dislocation by the thermal stress occurring during the immersion of a silicon single crystal into the molten silicon or, when the dislocation is generated at all, it will repress the length thereof. It will enable the dislocation generated in a seed crystal to be eliminated by dissolving the seed crystal bar to an extent greater than the diameter of the seed crystal. It will allow the silicon single crystal to be grown without requiring formation of a part of a decreased diameter by necking.

SUMMARY OF THE INVENTION

The present inventors discovery performed in accordance with the procedure of the invention has shown that even when the seed crystal has such a high boron concentration as is proper for a conventional technique, the silicon crystal grown from this seed crystal occasionally generated a dislocation. That is, though the prior art indeed has succeeded in repressing significantly the generation of dislocation in the single crystal, it has failed to prevent perfectly the generation of a dislocation. It has also failed to elucidate clearly the quantitative causal relation between any factor other than the boron concentration and the generation of a dislocation.

It is therefore an object of the present invention to provide a seed crystal for the production of a silicon single crystal which is capable of preventing the significant generation of a dislocation which occurs when the seed crystal is immersed in the molten silicon during the production of a silicon single crystal by the Czochralski method. It is also capable of withstanding the load of a large weight of the silicon single crystal. The present invention has a further object which is to provide a method for the production of a silicon single crystal which permits the dislocation free ratio to be increased in the process for the production of a silicon single crystal by the Czochralski method.

Concerning the present invention, there is a concern about the state of a surface treatment given to a seed crystal. There is also a special interest in the amount of strain particularly on the surface of the seed crystal which have initiated a study on the effect of the state of surface treatment of the seed crystal on the significant generation of a dislocation during the growth of a silicon single crystal. This study has resulted in novel knowledge being introduced. This invention has been perfected as a result. Further, regarding this invention, a keen attention directed to the temperature fluctuation of the molten silicon has initiated a study on the effect of this temperature fluctuation on the significant generation of a dislocation in the seed crystal during the contacting of the seed crystal with the melt. This study has brought a novel knowledge. This invention has been also perfected as a result.

To be specific, the present invention includes providing the following items.

(1) A seed crystal for the production of a silicon single crystal for use in the manufacture of a silicon single crystal by the Czochralski method, wherein the boron concentration in the silicon single crystal as the matrix from which the silicon seed crystal is excised is not less than $4\times10^{18}$ atoms/cm$^3$ and not more than $4\times10^{19}$ atoms/cm$^3$ and the silicon seed crystal is excised from the silicon single crystal as the matrix, ground, and lapped, and subsequently subjected to surface etching, providing the amount to be etched of at least the part of the silicon seed crystal that is contiguous to the melt of silicon satisfies the following formula (I), Formula I $$Y \geq \exp(-4.96 \times \log A + 18.7) \quad (I)$$

wherein Y denotes the amount to be etched ($\mu$m) and A denotes the size of particles (#) of a grindstone for the grinding specified in JIS (Japanese industrial standards) R 6001.

(2) A method for the production of a silicon single crystal by the Czochralski method, comprises using a seed crystal set forth in item (1) above and growing the crystal by pulling it without performing the dash necking process.

(3) A method for the production of a silicon single crystal by the Czochralski method, effected by using a seed crystal set forth in item (1) above and growing the crystal by pulling it without performing dash necking process and wherein the standard deviation of the temperature fluctuation of the melt of silicon in the time period of not less than 10 seconds is not more than 4° C.

(4) A method for the production of a silicon single crystal by the Czochralski method, effected by using a seed crystal set forth in item (1) above, partially melting the seed crystal in the melt of silicon, and subsequently growing the silicon single crystal by pulling without performing the dash necking process and wherein the amount to be melted of the seed crystal is not less than the diameter of the seed crystal and the standard deviation of the temperature fluctuation of the melt of silicon in a time period of not less than 10 seconds is not more than 4° C.

BRIEF DESCRIPTION OF THE DRAWING

FIG. 1 shows a graph illustrating the relation between the granularity of a grindstone used in processing a seed crystal and the thickness of a processing strain layer to be introduced.

DETAILED DESCRIPTION OF PREFERRED EMBODIMENTS

The present inventors, as a result of pursuing a diligent study on the significant generation of a dislocation during the production of a silicon single crystal, have discovered that the surface condition of a seed crystal is an important factor. It was also discovered that the residual processing strain developed in the surface of the seed crystal while the seed crystal is undergoing an operation of grinding and lapping forms the cause for the generation of dislocation. So long as this strain persists in the surface, the thermal stress occurring during the contact of the seed crystal and the melt gives rise to dislocation in the leading end part of the seed crystal even when the boron concentration in the seed crystal is so high as to add unduly to the hardness of the seed crystal.

If the boron concentration in the seed crystal is lesser than $4 \times 10^{18}$ atoms/cm$^3$, the shortage will prevent the seed crystal from acquiring sufficient hardness and increase the probability of the seed crystal generating a dislocation during the contact thereof with the melt. Conversely, if the boron concentration is greater than $4 \times 10^{19}$ atoms/cm$^3$, the seed crystal will likewise suffer the probability of inducing a dislocation on contact with the melt for no clear reason.

It has been found that the residual processing strain depends on the granularity (roughness) of the grindstone to be used in grinding or lapping the silicon single crystal bar. The term residual processing strain as used herein is defined by the image which is observed in the X-ray topography which will be specifically described herein below.

Generally, a silicon single crystal which is free from strain forms a uniform topographic pattern devoid of contrast. If this silicon single crystal has the presence of a processing strain, however, the strain causes the appearance of an image that is reflected in the strain. The reason for this phenomenon is that the lattice formed of silicon atoms is deformed in the presence of a processing strain. Also because of this deformation, the diffraction strength detected in the relevant silicon single crystal by measurement is heightened from the level that exists in the absence of such strain. As a result of a diligent study, it has been found that the granularity of the grindstone used in the operation of grinding or lapping and the thickness of a layer of processing strain form a fixed correlation. Specifically, it has been discovered that the relation of the following formula (II) exists between the granularity of the grindstone denoted by A (#) and the thickness of the processing strain denoted by Y ($\mu$m). The symbol A used herein represents the granularity (#) of the grindstone specified in JIS (Japanese industrial standard) R 6001.

Formula II $$Y = \exp(-4.96 \times \log A + 18.7) \quad \text{(II)}$$

This relation is graphically depicted in FIG. 1. The thickness of the processing strain is defined as the thickness of removal to be found by subjecting a given seed crystal which has undergone the treatments of grinding and lapping stepwise to an etching treatment and continuing this treatment until the X-ray topography ceases to show a visually discernible strain. By allowing the thickness of the etching subsequent to the steps of the grinding and the lapping to exceed the Y $\mu$m of the formula (II), therefore, the layer of the processing strain which is measurable by the X-ray topography can be removed. Thus, the ratio of the liberation of the dislocation during the operation of pulling a silicon single crystal is conspicuously improved by setting the thickness of etching at a magnitude of not less than Y $\mu$m. Since the strain resolving power of the X-ray topography is 0.2 $\mu$m, the ratio of the removal of the dislocation during the operation of the pulling of a silicon single crystal is improved by decreasing the thickness of the residual processing strain on the surface of a seed crystal to a level of not more than 0.2 $\mu$m.

Incidentally, the aqueous solution of a mixture of hydrofluoric acid and nitric acid is generally used as the etching liquid. Some other composition which is capable of securing the required smoothness of the surface by means of etching may be used so long as the layer of the processing strain, Y, defined by the formula (II) can be removed. When the aqueous solution of the mixture of hydrofluoric acid and nitric acid is used, since hydrofluoric acid etches silicon at a higher speed than nitric acid, it is preferred to use nitric acid in an excess amount in the compounding ratio of the two acids. Preferably, the volume ratio of hydrofluoric acid:nitric acid is in the range of 1:3~8. When the etching entails a problem of heavily coarsening the surface or a problem of forming a film on the silicon surface, the problem may be prevented by adding such a mitigating agent as acetic acid. The amount of acetic acid to be added is preferred to be in the range of 2~8 relative to the compounding ratio of hydrofluoric acid and nitric acid mentioned above. To be more specific, the compounding ratio of hydrofluoric acid:nitric acid:acetic acid is preferred to be in the range of 1:(3~8):(2~8) for the purpose of avoiding infliction of a coarsened surface or the formation of a coated surface. The reason for this range is that if the amount of acetic acid to be added falls short of 2, the shortage will lower the effect of the addition and if it exceeds 8, the excess will bring a conspicuous decrease in the speed of the etching silicon.

The grindstone to be used for the operation of grinding and lapping is preferred to be such ceramics as SiC or Al$_2$O$_3$ or diamond which has low chemical reactivity to Si. When such a grindstone is used, since the thickness of a processing strain layer is substantially determined not by the material of the grindstone but by the granularity thereof, it suffices to remove by etching a thickness exceeding the thickness of the processing strain layer, depending on the granularity of the grindstone. The leading end of the seed crystal fated to be immersed in the melt does not need to be shaped convexly downward, but may be of a flat shape. The leading end face of the seed crystal which is of a flat shape and the diametrically converged portion of the seed crystal which is shaped convexly downward are preferred to have their outer peripheral parts chamfered.

The reason for this chamfering is that these outer peripheral parts are liable to sustain a break called a chipping while the leading end is being ground and entail the possibility of inducing generation of strain as far as a region deeper than the layer of processing strain formed on account of the granularity of the grindstone. When the chamfering is performed, the strain caused by a chipping can be removed by setting the radius of curvature of chamfering at a level of not less than 100 μm. When the chamfered part sustains a chipping, it can be worked and turned into a layer of processing strain defined by the formula (II) by grinding the affected part with a grindstone of low granularity and further grinding it with a grindstone of higher granularity. From a practical point of view, the radius of curvature of chamfering is preferred to be set at 5 mm. If the radius of curvature of chamfering is unduly enlarged, the excess will necessitate an unduly long processing time because the silicon single crystal is so brittle as to render the processing difficult. Incidentally, when the chipping occurs during the course of processing, the chipping part and the remaining surface of the seed crystal are preferred to be in an equally processed state. This is because the thickness of the etching subsequent to the processing must be conformed to the region of the largest thickness in the layer of processing strain.

In the present invention, when the seed crystal contemplated by this invention as described above is used in the production of a silicon single crystal, since it has no surface layer of processing strain, the seed crystal and the silicon single crystal grown therefrom do not particularly permit the easy generation of a dislocation. This dislocation would be due to the thermal stress caused when the seed crystal is immersed in molten silicon. Thus, the production of a silicon single crystal of a large diameter which is capable of withstanding a load of a large weight and devoid of dislocation can be realized without requiring formation of a part of decreased diameter by dash necking.

Further, the present inventors, as a result of a diligent study pursued concerning the significant generation of a dislocation during the production of a silicon single crystal, have found the following. Even when a seed crystal which is devoid of residual processing strain as described above is used, the generation of a dislocation may occur unless the temperature fluctuation of the molten silicon is repressed. The reason for this phenomenon will be described herein below.

The molten silicon, particularly the melt which is held in a large crucible and readied for producing a large crystal by pulling, assumes a turbulent state and embraces temperature fluctuations with a various range of time period. Among these temperature fluctuations mentioned above, the temperature fluctuations having a period of not less than 10 seconds particularly exert a large effect on the generation of a dislocation. Due to these temperature fluctuations, the seed crystal is rapidly grown and melted during the immersion in the melt. Specifically, the crystal rapidly grows when the melt of low temperature approximates closely to the seed crystal and it rapidly melts when the melt of high temperature approximates closely to the seed crystal. The rapid growth and the rapid melting possibly entail the generation of a dislocation. The temperature fluctuations which have a period falling short of 10 seconds exert a small effect. The reason for this small effect is that a rapid temperature fluctuation is not easily transmitted to the seed crystal. Also rapid growth and rapid melting of the crystal do not easily occur because the temperature boundary layer existing between the melt and the seed crystal functions as a low pass filter.

The seed crystal, depending on the condition of its pulling, sustains a very large thermal stress during the contact thereof with the melt. Even when the seed crystal to be used has no such processing strain as mentioned above, it has the possibility of sustaining a dislocation. In this case, the dislocation which has been introduced during the contact of the seed crystal with the melt can be melted until elimination by causing the seed crystal to be melted in a prescribed amount in the melt as disclosed in the official gazette of JP-A-09-249,492, for example. Since the seed crystal which has a high boron concentration is hard, the dislocation which is generated in the seed crystal during the contact thereof with the melt has a small length. This dislocation of the seed crystal is not elongated during the immersion thereof in the melt. When the processing strain persists on the lateral face of the seed crystal, however, the probability of the seed crystal introducing a dislocation through the triple point of crystal-melt-gas (outer peripheral line of the seed crystal) on the lateral face thereof by virtue of freshly generated thermal stress is high. Even when the seed crystal bearing this dislocation is immersed in the melt in an effort to attain final elimination of the dislocation by melt, the dislocation cannot be finally eliminated because the dislocation is successively generated by a newly formed triple point. It is, therefore, necessary to have the lateral face of the seed crystal relieved of the residual processing strain from the beginning so as to prevent the seed crystal immersed in the melt from generating a dislocation. Specifically, it is necessary that the layer which is devoid of the surface processing strain be formed in advance at least throughout the entire region of the seed crystal that is immersed in the melt.

Now, the boron concentration in the seed crystal contemplated by the present invention, the surface processing treatment, and the relation between the variation in the temperature of the melt and the ratio of the liberation of the dislocation (ratio of DF) from the single crystal grown from the melt will be described below based on working examples presented for illustration herein below.

EXAMPLES

The seed crystal used herein was in the shape of a cylinder 13 mm in diameter, cut from a silicon single crystal ingot and then subjected to a grinding treatment and to a surface treatment which will be specifically described herein below.

The growth of a silicon single crystal by the Czochralski method was executed by placing this seed crystal into position in a holder and then initiating the growth thereof in an atmosphere of argon gas. In a heated crystal growing furnace, polycrystalline silicon was melted and the seed crystal was slowly lowered toward the surface of the molten silicon.

Particularly from the region of a temperature of 1300° C. to the position at which the seed crystal touched the melt, the lowering speed of the seed crystal was set at 1 mm/min. This was for the purpose of avoiding the generation of thermal stress due to a sudden change in the temperature of the seed crystal. After the seed crystal had touched the melt, it was immersed as occasion demanded in a prescribed length into the melt. The seed crystal was left to dissolve therein until the seed crystal adopted itself to the melt. Thereafter, the growth of a crystal was commenced. During the growth of this crystal, the crystal in a state not undergoing a dash necking treatment was gradually diverged to form a conical part, stopped widening at a diameter of 300 mm, and grown continuously at this diameter to form a straight body part 500 mm in length.

In the working examples and the controls, the growth under the growing conditions mentioned above was performed up to 10 repetitions to effect evaluation of the DF ratio. The DF ratio was rated by longitudinally slicing the grown single crystal and examining the whole ingot. This examining included the seed crystal part by the X-ray topography to examine for the presence or the absence of dislocation therein. In a single crystal whose longitudinal section showed a sign of dislocation, if only slightly, by the X-ray topography, the DF was reported as 0. The DF ratio was calculated in terms of the proportion of the number of ingots showing no sign of dislocation to the total of ten ingots used in the repeated experiments.

The surface processing finished the seed crystal in the shape of a cylinder by the use of a cylindrical grinder and, at the same time, imparted to the leading end thereof a flat shape or a convexly downward shape. At this time, by using SiC or diamond as the grindstone for the surface processing, the seed crystal was ground and lapped with the prescribed granularity of the grindstone. Meanwhile, regarding the chamfering work, the outer peripheral part of the leading end face when the leading end has a flat shape or the diametrically converged portion when the leading end has a convexly downward shape was ground and lapped until a radius of curvature of 1 mm was produced. The removal of the surface layer of the seed crystal which had been ground and lapped was effected by etching the surface layer with the aqueous solution of a mixture composed of hydrofluoric acid and nitric acid at a volume ratio of 1:8. The difference found by subtracting the diameter of the seed crystal after the treatment from the original diameter of the seed crystal was reported as the thickness of the surface layer removed by the etching.

Table 1 shows the boron concentration in the seed crystal, the numerical grade of a finishing grindstone, the thickness removed by etching, the standard deviation of the melt temperature fluctuations with time periods of not less than 10 seconds, the presence of fusion of the seed crystal in a size exceeding the diameter thereof, and the manner of change of DF coefficient caused by the combination of varying conditions which were obtained in each of Examples 1–8 and Controls 1–4.

In Examples 1 and 2, the DF coefficients both had a high magnitude of 70% because the boron concentrations were in a proper range and the layers of processing distortion were removed from the surfaces by etching. In Examples 3 and 4, the DF coefficients had magnitudes exceeding 90% because the standard deviations of melt temperature fluctuations with time periods of not less than 10 seconds were repressed below 4° C. in addition to the preceding conditions. In Examples 5 to 8, the DF coefficients were further increased to 100% because the leading ends of seed crystals were fused each to a length equal to the diameter of seed crystal besides the conditions of Examples 3 and 4.

In Controls 1 and 2, though the amounts of etching were sufficient, the fluctuations of melt temperature were as small as 4° C., and the leading ends of seed crystals were fused to a size equal to the diameter of the crystal, the seed crystals generated dislocation from their surfaces, the barrel parts of grown ingot also suffered growth of dislocation, and the DF coefficients fell to 0% because the boron concentrations in the seed crystals were as small as $3 \times 10^{18}$ and as large as $5 \times 10^{19}$ respectively. In controls 3 and 4, notwithstanding the boron concentrations in the seed crystals were in a proper range, the fluctuations of melt temperature were as small as 4° C., and the leading ends of seed crystals were fused in a size equal to the diameter of crystal, the DF coefficients were as small as 10% because the amounts of etching were unduly small.

TABLE 1

|  | Boron concentration in seed crystal (atoms/cm³) | Granularity of finishing grindstone (#) | Thickness of removal by etching (μm) | Standard deviation of temperature fluctuation of melt in cycles of not less than 10 seconds (° C.) | Dissolution of seed crystal (dissolution length: the diameter of crystal) | DF ratio (%) |
| --- | --- | --- | --- | --- | --- | --- |
| Example 1 | $7 \times 10^{18}$ | 1500 | 50 | 5 | None | 70 |
| Example 2 | $7 \times 10^{18}$ | 400 | 500 | 5 | None | 70 |
| Example 3 | $7 \times 10^{18}$ | 1500 | 50 | 4 | None | 90 |
| Example 4 | $7 \times 10^{18}$ | 400 | 500 | 4 | None | 90 |
| Example 5 | $7 \times 10^{18}$ | 1500 | 50 | 4 | Yes | 100 |
| Example 6 | $4 \times 10^{18}$ | 1500 | 50 | 4 | Yes | 100 |
| Example 7 | $4 \times 10^{19}$ | 1500 | 50 | 4 | Yes | 100 |
| Example 8 | $7 \times 10^{18}$ | 400 | 500 | 4 | Yes | 100 |
| Control 1 | $3 \times 10^{18}$ | 1500 | 50 | 4 | Yes | 0 |
| Control 2 | $5 \times 10^{19}$ | 1500 | 50 | 4 | Yes | 0 |
| Control 3 | $7 \times 10^{18}$ | 1500 | 10 | 4 | Yes | 10 |
| Control 4 | $7 \times 10^{18}$ | 400 | 300 | 4 | Yes | 10 |

Effect of the Invention

The seed crystal contemplated by the present invention is endowed with rigidity due to the high boron concentration and divested of a processing strain layer because of a surface treatment and, therefore, prevented from succumbing readily to the influence of thermal stress. Thus, the present invention can provide a seed crystal which inhibits the easy generation of a dislocation without requiring dash necking.

Further, this seed crystal can be produced in accordance with the conventional procedure for the manufacture of a seed crystal without imparting any modification thereto. Thus, the present invention can provide a method for the production of an inexpensive seed crystal.

By using this seed crystal for the production of a silicon single crystal, it is possible to grow easily a silicon single crystal of large diameter and great weight without incurring the generation of a dislocation. This achievement not merely manifests the effect thereof by greatly decreasing the cost of production of a silicon single crystal of large diameter and great weight. In addition it also fulfills such purposes as enlarging the diameter of the seed crystal. This consequently increases the amount of load withstood, preventing an ingot formed by the growth of the silicon single crystal from incurring such accidents as breaking and dropping. It also drastically improves the operational safety during the production of a silicon single crystal of large diameter and great weight.

Accordingly, while a few embodiments of the present invention have been shown and described, it is to be understood that many changes and modifications may be made thereunto without departing from the spirit and scope of the invention as defined in the appended claims.

What is claimed is:

1. A silicon seed crystal for a production of a silicon single crystal by the Czochralski method, comprising a boron concentration in the silicon single crystal as a matrix from which a silicon seed crystal is excised is not less than $4 \times 10^{18}$ atoms/cm$^3$ and not more than $4 \times 10^{19}$ atoms/cm$^3$; and said silicon seed crystal is excised from the silicon single crystal as the matrix, ground, and lapped, and subsequently subjected to surface etching, providing an amount to be etched of at least a part of said silicon seed crystal that is contiguous to a melt of silicon and satisfying a following formula (I), Formula I $$Y \geq \exp(-4.96 \times \log A + 18.7) \quad (I)$$

wherein Y denotes an amount to be etched (μm) and A denotes a size of particles (#) of a grindstone for a grinding specified in JIS (Japanese industrial standards) R 6001.

2. A method for a production of a silicon single crystal by the Czochralski method, comprising providing a silicon seed crystal for said production of said silicon single crystal by the Czochralski method, comprising a boron concentration in the silicon single crystal as a matrix from which a silicon seed crystal is excised is not less than $4 \times 10^{18}$ atoms/cm$^3$ and not more than $4 \times 10^{19}$ atoms/cm$^3$; and said silicon seed crystal being excised from the silicon single crystal as the matrix, ground, and lapped, and subsequently subjected to surface etching, providing an amount to be etched of at least a part of said silicon seed crystal that is contiguous to a melt of silicon and satisfying a following formula (I), Formula I $$Y \geq \exp(-4.96 \times \log A + 18.7) \quad (I)$$

wherein Y denotes an amount to be etched (μm) and A denotes a size of particles (#) of a grindstone for a grinding specified in JIS (Japanese industrial standards) R 6001; and using said silicon seed crystal and growing the silicon single crystal by pulling it without performing a dash necking process.

3. A method for the production of a silicon single crystal by the Czochralski method according to claim 2, wherein standard deviation of temperature fluctuation of a melt of silicon in a time period of not less than 10 seconds is not more than 4° C.

4. A method for the production of a silicon single crystal by the Czochralski method according to claim 3, comprising partially melting the silicon seed crystal in the melt of silicon, an amount to be melted of the silicon seed crystal not less than the diameter of the silicon seed crystal, and subsequently growing the silicon single crystal by pulling without performing a dash necking process.

* * * * *